(12) United States Patent
Yoon et al.

(10) Patent No.: US 12,279,384 B2
(45) Date of Patent: Apr. 15, 2025

(54) DISPLAY DEVICE

(71) Applicant: LG DISPLAY CO., LTD., Seoul (KR)

(72) Inventors: Sung-Hwan Yoon, Paju-si (KR);
Young-Kyu Bang, Paju-si (KR);
Seoung-Mo Kang, Paju-si (KR);
Eun-Gi Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 208 days.

(21) Appl. No.: 18/074,461

(22) Filed: Dec. 3, 2022

(65) Prior Publication Data

US 2023/0209746 A1   Jun. 29, 2023

(30) Foreign Application Priority Data

Dec. 27, 2021   (KR) .................. 10-2021-0187980

(51) Int. Cl.
*H05K 5/02*   (2006.01)
*H05K 5/03*   (2006.01)

(52) U.S. Cl.
CPC ............ *H05K 5/0217* (2013.01); *H05K 5/03* (2013.01)

(58) Field of Classification Search
CPC ... G06F 1/1652; G06F 1/1601; H10K 77/111; H10K 2102/311; H10K 59/12; G09F 9/301; G09F 9/35; G09F 11/02; G09F 11/08; H05K 1/028; H05K 2201/051; H05K 5/03; H05K 5/0217; H02K 7/003; H02K 7/116; H02K 7/14
See application file for complete search history.

(56) References Cited

U.S. PATENT DOCUMENTS

| | | | |
|---|---|---|---|
| 2011/0216483 A1* | 9/2011 | Vesely .................. | G06F 1/1624 361/679.01 |
| 2015/0035812 A1* | 2/2015 | Shin ...................... | G06F 1/1601 345/204 |
| 2018/0114471 A1* | 4/2018 | Park ...................... | G06F 1/1652 |
| 2018/0125228 A1* | 5/2018 | Porter .................. | H05K 5/0017 |
| 2019/0138054 A1* | 5/2019 | Alva ..................... | G06F 1/1624 |
| 2020/0043386 A1* | 2/2020 | Kim ....................... | G09F 9/301 |

FOREIGN PATENT DOCUMENTS

| | | |
|---|---|---|
| KR | 10-1923924 B1 | 11/2018 |
| KR | 10-2221996 B1 | 2/2021 |
| KR | 10-2021-0050800 A | 5/2021 |

* cited by examiner

*Primary Examiner* — Jacob R Crum
(74) *Attorney, Agent, or Firm* — Fish & Richardson P.C.

(57) ABSTRACT

A display device includes a cover module having a storage space therein, a display panel configured to be at least partially disposed inside the storage space or withdrawn outside the storage space, and a first driving system configured to embed and withdraw the display panel into and from the cover module in a first direction, wherein the first driving system includes a first wire drum and a first driving wire.

21 Claims, 13 Drawing Sheets

DISPLAY DEVICE

CROSS-REFERENCE TO RELATED APPLICATION

The present application claims the priority of Korean Patent Application No. 10-2021-0187980 filed on Dec. 27, 2021, which is hereby incorporated by reference in its entirety.

BACKGROUND

Field of the Disclosure

The present disclosure relates to a display device, and more particularly to, for example, without limitation, a display device including a display panel capable of being raised or lowered.

Description of the Background

In recent years, with entering into a full-fledged information age, there is a growing interest in information display dealing with and displaying mass information. In response to this, various flat panel display devices have been developed and have been in the spotlight.

Specific examples of the flat panel display devices include liquid crystal display (LCD) devices, plasma display panel (PDP) devices, field emission display (FED) devices, electroluminescence display (ELD) devices, organic light-emitting diode display (OLED) devices. The flat panel display devices show excellent performance of thin thickness, light weight, and low power consumption and have rapidly replaced cathode ray tube (CRT) display devices.

Recently, in the progress of further development of technologies for implementing such display devices, technologies for realizing various display devices desired by consumers are also required beyond the technology for displaying an image.

Among these, research is being actively conducted to realize various types of display devices in which a display panel is coupled to structures such as furniture, appliances, vehicle, and facilities, and to have advantages of space utilization, interior, and design.

The description provided in the description of this section should not be assumed to be prior art merely because it is mentioned in or associated with the description of the section. The description of the section may include information that describes one or more aspects of the subject technology.

SUMMARY

Therefore, the inventors have recognized requirements described above. Accordingly, aspects of the present disclosure are to provide a display device that substantially obviates one or more of the issues due to limitations and disadvantages described above.

More specifically, various aspects of the present disclosure are to provide a display device capable of embedding or withdrawing a display panel in a structure as necessary.

Various aspects of the present disclosure are also to provide a display device in which a display panel is allowed to be embedded in or withdrawn from the inside of the structure with a simple configuration and operation.

Various aspects of the present disclosure are also to provide a display device capable of raising or lowering a display panel more stably in the process of embedding or withdrawing the display panel.

Additional features and aspects will be set forth in the description that follows, and in part will be apparent from the description, or may be learned by practice of the inventive concepts provided herein. Other features and aspects of the inventive concepts may be realized and attained by the structures particularly pointed out in the present disclosure, or derivable therefrom, and the claims hereof as well as the appended drawings.

To achieve these and other aspects of the inventive concept, as embodied and broadly described herein, a display device includes a cover module having a storage space therein, a display panel configured to be at least partially disposed inside the storage space or withdrawn outside the storage space, and a first driving system configured to embed and withdraw the display panel into and from the cover module in a first direction, wherein the first driving system may include a first wire drum and a first driving wire.

To achieve these and other aspects of the inventive concept, as embodied and broadly described herein, a display device includes a cover module including a front cover and a rear cover and having a storage space therebetween; a display panel configured to be at least partially disposed inside the storage space or withdrawn outside the storage space; a light blocking plate on a rear surface of the display panel and configured to be at least partially embedded inside the storage space or withdrawn outside the storage space; a first driving system disposed in the front cover and configured to move the display panel into and outside the cover module in a first direction; and a second driving system disposed in the rear cover and configured to move the light blocking plate into and outside the cover module in the first direction, wherein the display panel and light blocking plate may be configured to be individually or simultaneously moved in the first direction through the first driving system and second driving system, respectively.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which may be included to provide a further understanding of the present disclosure and may be incorporated in and constitute a part of the disclosure, illustrate aspects of the disclosure and together with the description serve to explain various principles of the present disclosure.

In the drawings.

Throughout the drawings and the detailed description, unless otherwise described, the same drawing reference numerals should be understood to refer to the same elements, features, and structures.

DETAILED DESCRIPTION

Figure 1A:
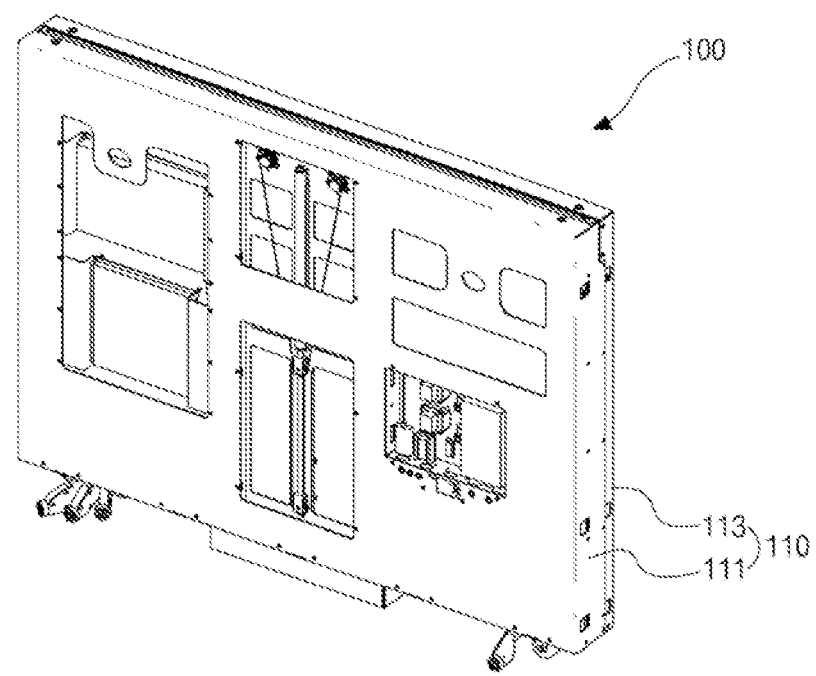
FIG. 1A is a perspective view schematically illustrating a display device with a display panel in an embedded state according to an aspect of the present disclosure.

Reference will now be made in detail to the exemplary aspects of the present disclosure, examples of which may be illustrated in the accompanying drawings. Wherever possible, the same reference numbers will be used throughout the drawings to refer to the same or like parts.

Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects may be provided so that this disclosure may be sufficiently thorough and complete to assist those skilled in the art to will fully understand the scope of the present disclosure.

Shapes, sizes, areas, ratios, angles, and numbers disclosed in the drawings for describing aspects of the present disclosure may be merely example, and thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration will be omitted or may be briefly provided. When terms "comprise," "have," and "include" described in the present disclosure may be used, another part may be added unless a more limiting term, such as "only" is used. The terms of a singular form may include plural forms unless referred to the contrary.

In construing an element, the element is construed as including an error or tolerance range although there is no explicit description of such an error or tolerance range.

In the description of the various aspects of the present disclosure, where position relationships, for example, where a positional relation between two parts is described using "on," "over," "under," "above," "below," "beside" and "next" or the like, one or more other parts may be located between the two parts unless a more limiting term, such as "immediate(ly)" or "direct(ly)" is used.

In describing a temporal relationship, for example, when the temporal order is described as, for example, "after," "subsequent," "next," and "before," a case that is not continuous may be included unless a more limiting term, such as "just," "immediate(ly)," or "direct(ly)" is used.

In describing elements of the present disclosure, the terms "first," "second," "A," "B," "(a)," "(b)," etc. may be used. These terms may be merely for differentiating one element from another element, and the essence, sequence, basis, order, or number of the corresponding elements should not be limited by these terms. The expression that an element is "connected," "coupled," or "adhered" to another element or layer should be understood to mean that the element or layer can not only be directly connected or adhered to another element or layer, but also be indirectly connected or adhered to another element or layer with one or more intervening elements or layers being "disposed," or "interposed" between the elements or layers, unless otherwise specified.

The term "at least one" should be understood as including any and all combinations of one or more of the associated listed items. For example, the meaning of "at least one of a first item, a second item, and a third item" encompasses the combination of all three listed items, combinations of any two of the three items as well as each individual item, the first item, the second item, or the third item.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, aspects of the present disclosure will be described in detail with reference to the accompanying drawings. Also, for convenience of description, a scale, size and thickness in which each of elements is illustrated in the accompanying drawings may differ from a real scale, size and thickness, and thus, the illustrated elements are not limited to the specific scale, size and thickness in which they are illustrated in the drawings.

Figure 1B:
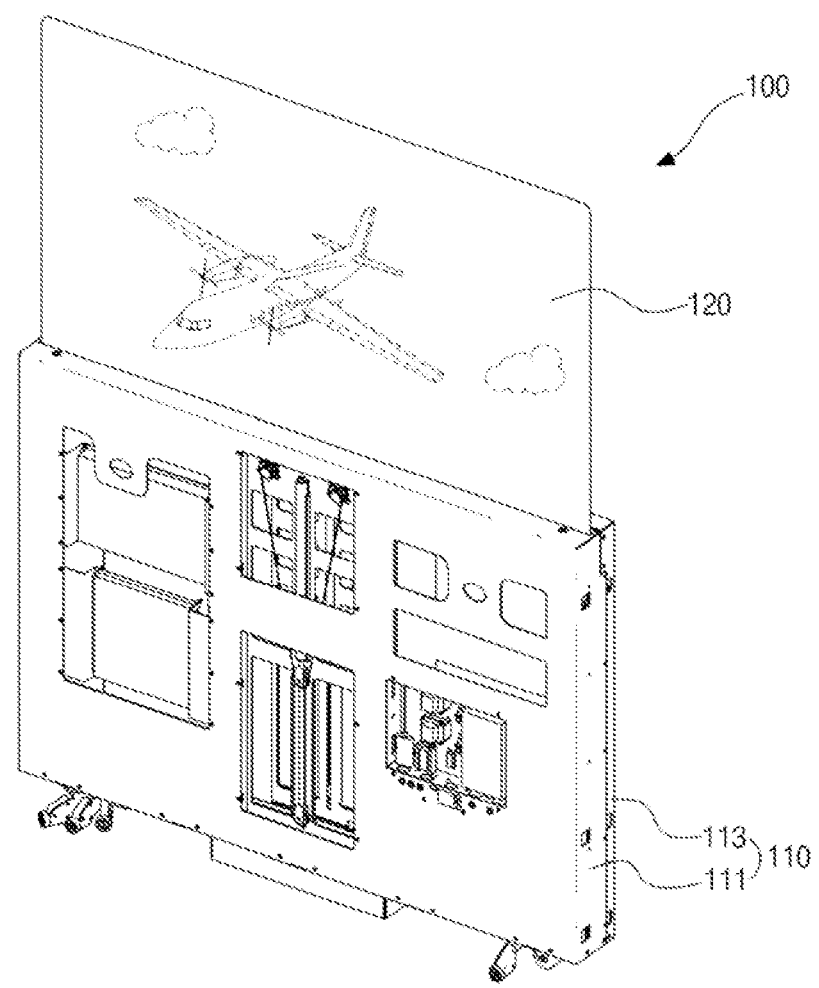
FIG. 1B, FIG. 1C and FIG. 1D are perspective views schematically illustrating a display device with a display panel in various withdrawn states according to an aspect of the present disclosure.
Figure 1C:
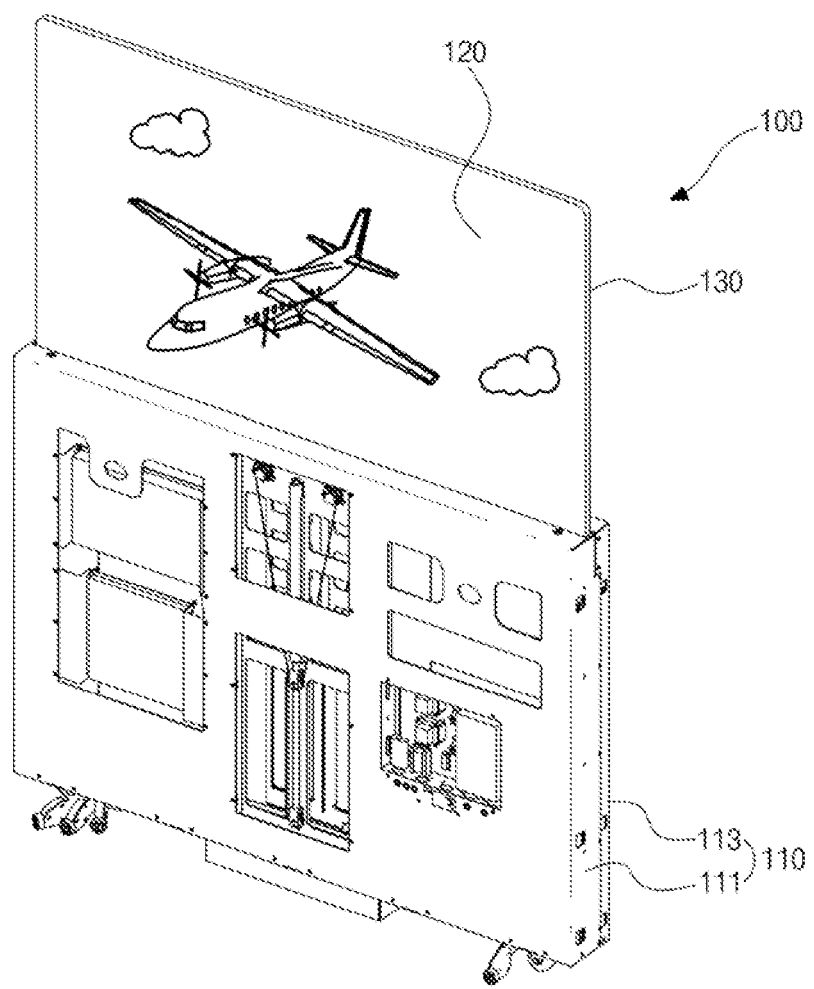
Figure 1D:
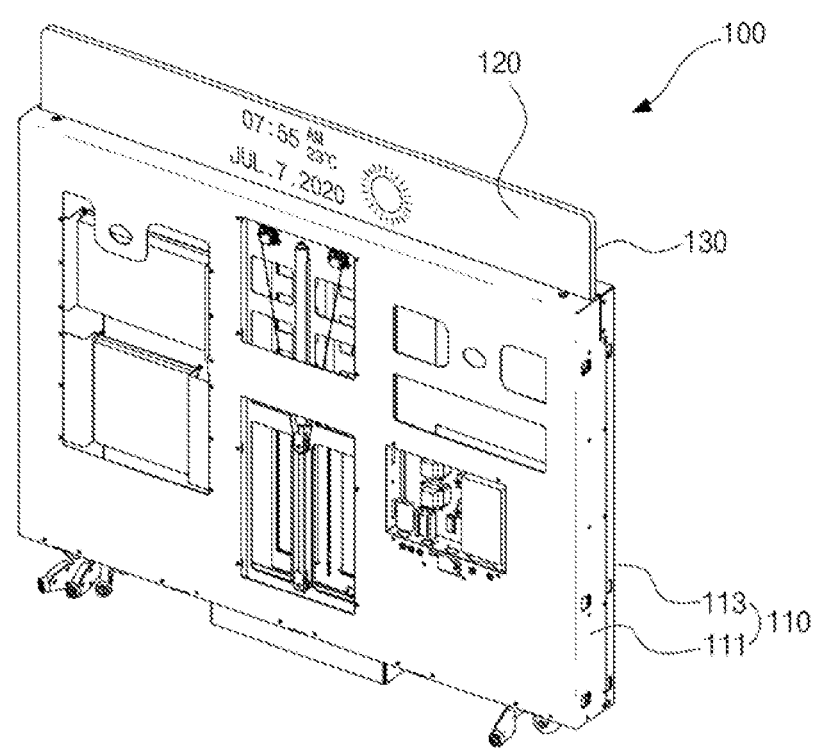

FIG. 1A is a perspective view schematically illustrating a display device with a display panel in an embedded state according to an aspect of the present disclosure, and FIGS. 1B, 1C and 1D are perspective views schematically illustrating a display device with a display panel in a various withdrawn states according to an aspect of the present disclosure.

As shown in FIG. 1A, the display device 100 includes a display panel 120 that is embedded in a cover module 110. The cover module 110 can be coupled to furniture, an appliance, a facility, or the like such as a bed headboard, a desk, or a partition. But the present disclosure is not limited thereto.

The display panel 120 pulled down and embedded inside the cover module 110 and, as shown in FIG. 1B, can be pulled up and withdrawn entirely to the outside of the cover module 110.

Here, the display panel 120 according to an aspect of the present disclosure can be formed of a transparent display panel, so that the user can see the object or image located on the opposite side through the display panel 120. In addition, the user can watch an image at both one side and the other side of the display panel 120.

When the display panel 120 is formed of a transparent display panel, as shown in FIG. 1C, a light blocking plate 130 can be further withdrawn from the cover module 110 to the rear surface of the display panel 120.

By preventing the object or image located on the opposite side of the display panel 120 from being transmitted through the light blocking plate 130, the concentration of an image implemented through the display panel 120 can be improved. Accordingly, the user can feel the image implemented from the display panel 120 more clearly.

That is, the transparent display panel can realize the functions of information recognition, information processing, and information display as a transparent electronic device, thereby solving the spatial and visual constraints of existing electronic devices.

For example, the transparent display panel can be implemented as a smart window that is applied to a window of a building or a car to show a background or display an image. As recognized by the inventor of present disclosure, the transparent display panel does not have a limitation in contrast ratio in a dark environment, but has a disadvantage in that the contrast ratio is lowered in a general environment with light.

Therefore, the light blocking plate 130 can be further withdrawn from the cover module 110 to the rear surface of the display panel 120 so that a light blocking mode for blocking light and a transmission mode for transmitting light can be implemented in order to prevent or reduce a decrease in the contrast ratio of the transparent display panel.

In addition, as shown in FIG. 1D, in the display device 100 according to an aspect of the present disclosure, only a part of the display panel 120 can be withdrawn from the cover module 110, and most of the display panel 120 can be embedded inside the cover module 110, so that an Always On Display (AOD) device can also be implemented.

The AOD device can display AOD data that the user can check at any time even in a state where no image is displayed on the display panel 120. The AOD data can include and not limit to information on date, time, weather, event alarming, and the like, and the AOD data can be variously changed according to the user's setting.

Figure 2:
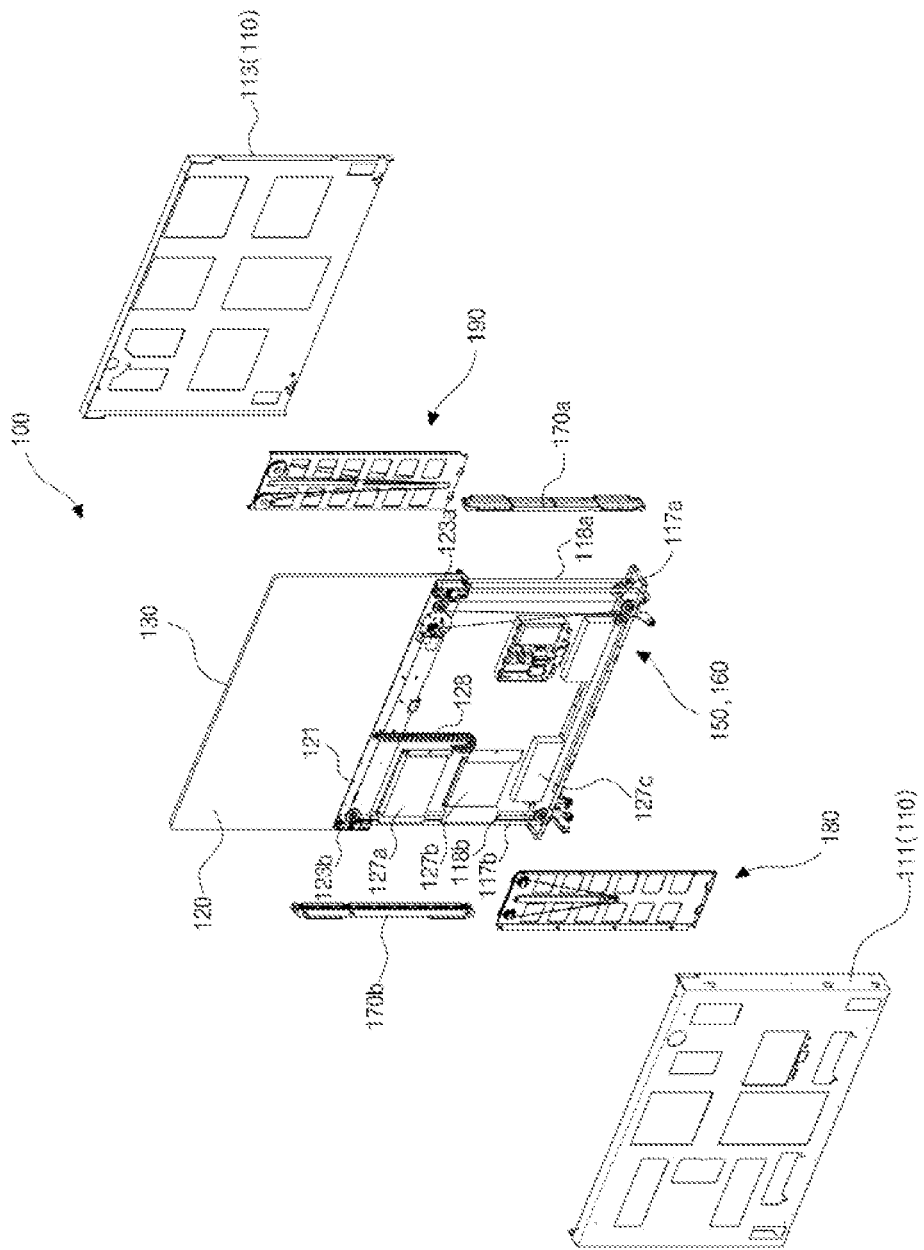
FIG. 2 is an exploded perspective view illustrating a display device according to an aspect of the present disclosure.
Figure 3A:
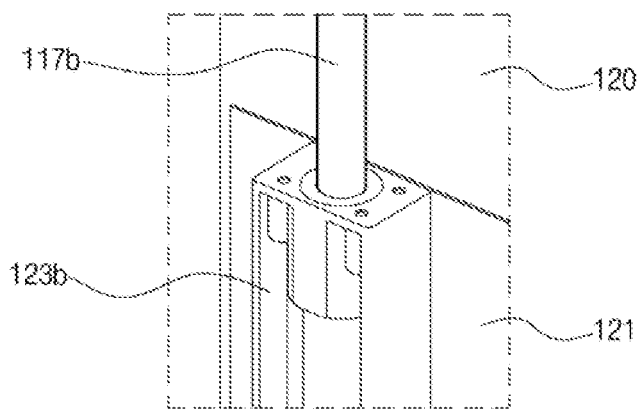
FIG. 3A is a perspective view illustrating a configuration of a bushing and a guide bar according to an aspect of the present disclosure.
Figure 3B:
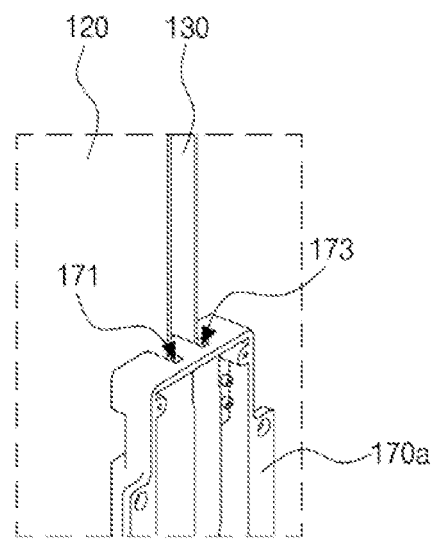
FIG. 3B is a perspective view illustrating a configuration of a guide rail according to an aspect of the present disclosure.

FIG. 2 is an exploded perspective view illustrating a display device according to an aspect of the present disclosure. FIG. 3A is a perspective view illustrating a configuration of a bushing and a guide bar according to an aspect of the present disclosure, and FIG. 3B is a perspective view illustrating a configuration of a guide rail according to an aspect of the present disclosure.

Figure 4A:
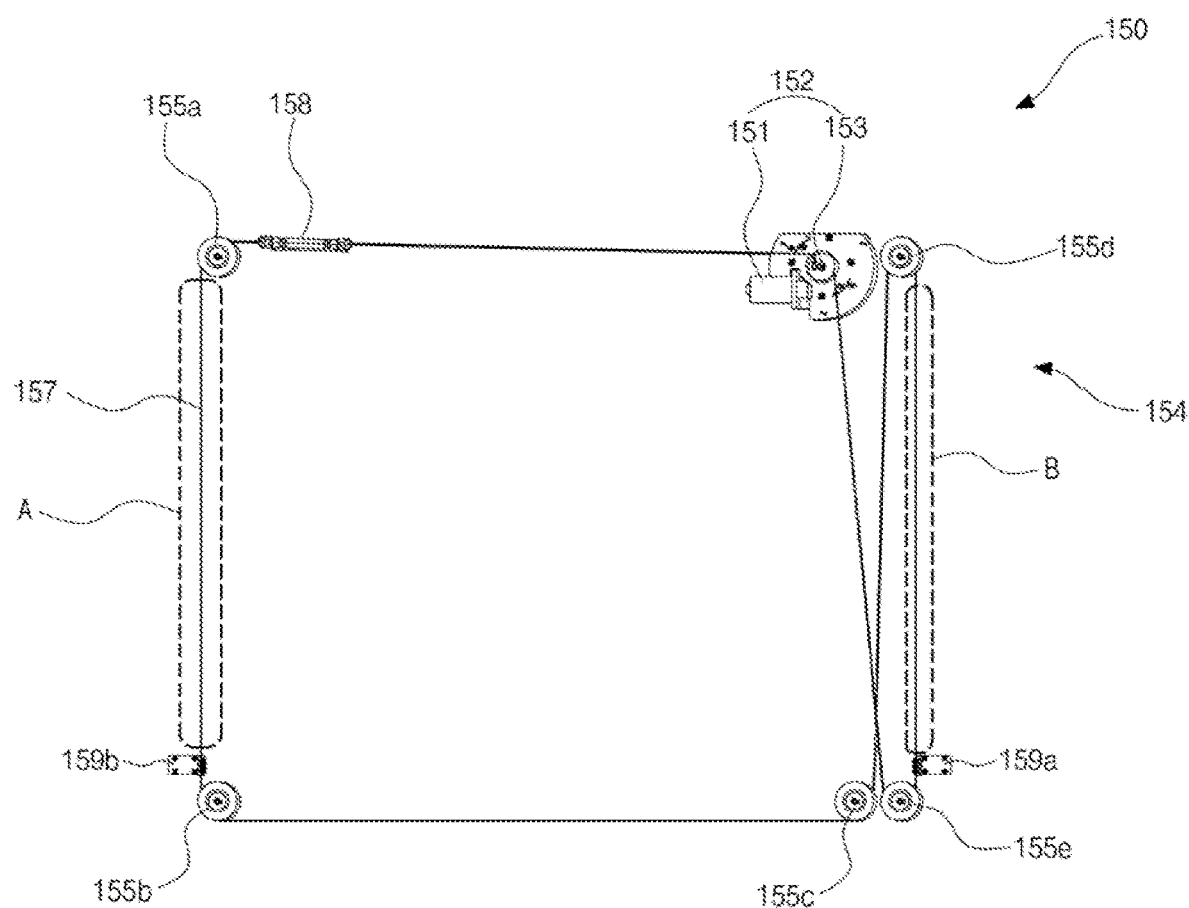
FIG. 4A is a perspective view illustrating a first driving system according to an aspect of the present disclosure.
Figure 4B:
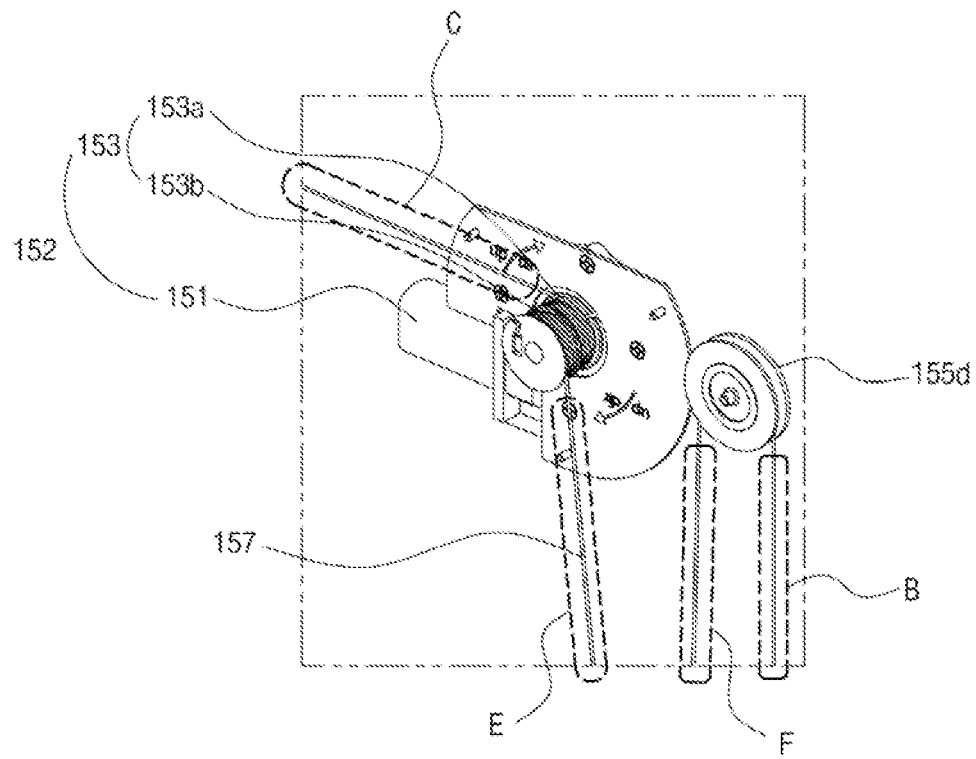
FIG. 4B is a perspective view illustrating a first motor assembly according to an aspect of the present disclosure.
Figure 4C:
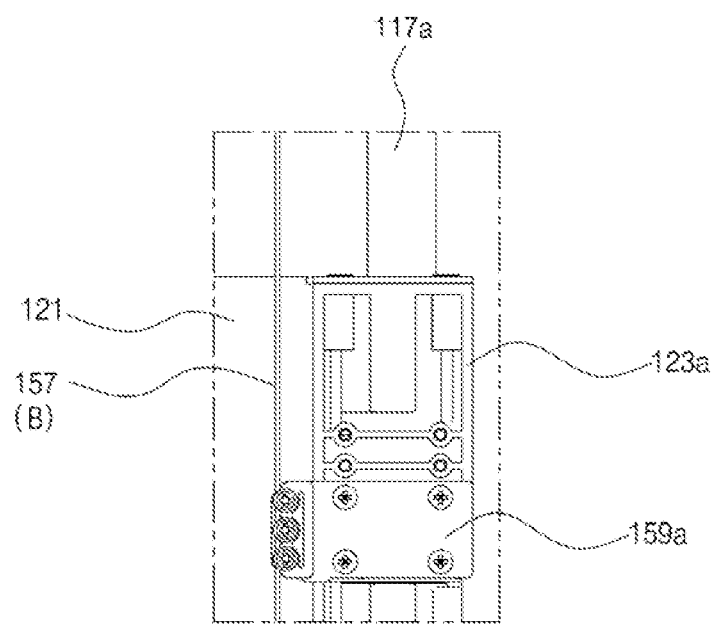
FIG. 4C is a perspective view illustrating a state in which the first driving system and the display panel are connected to each other according to an aspect of the present disclosure.

FIG. 4A is a perspective view illustrating a first driving system according to an aspect of the present disclosure, FIG. 4B is a perspective view illustrating a first motor assembly according to an aspect of the present disclosure, and FIG. 4C is a perspective view illustrating a state in which the first driving system and the display panel are connected to each other according to an aspect of the present disclosure.

Figure 5A:
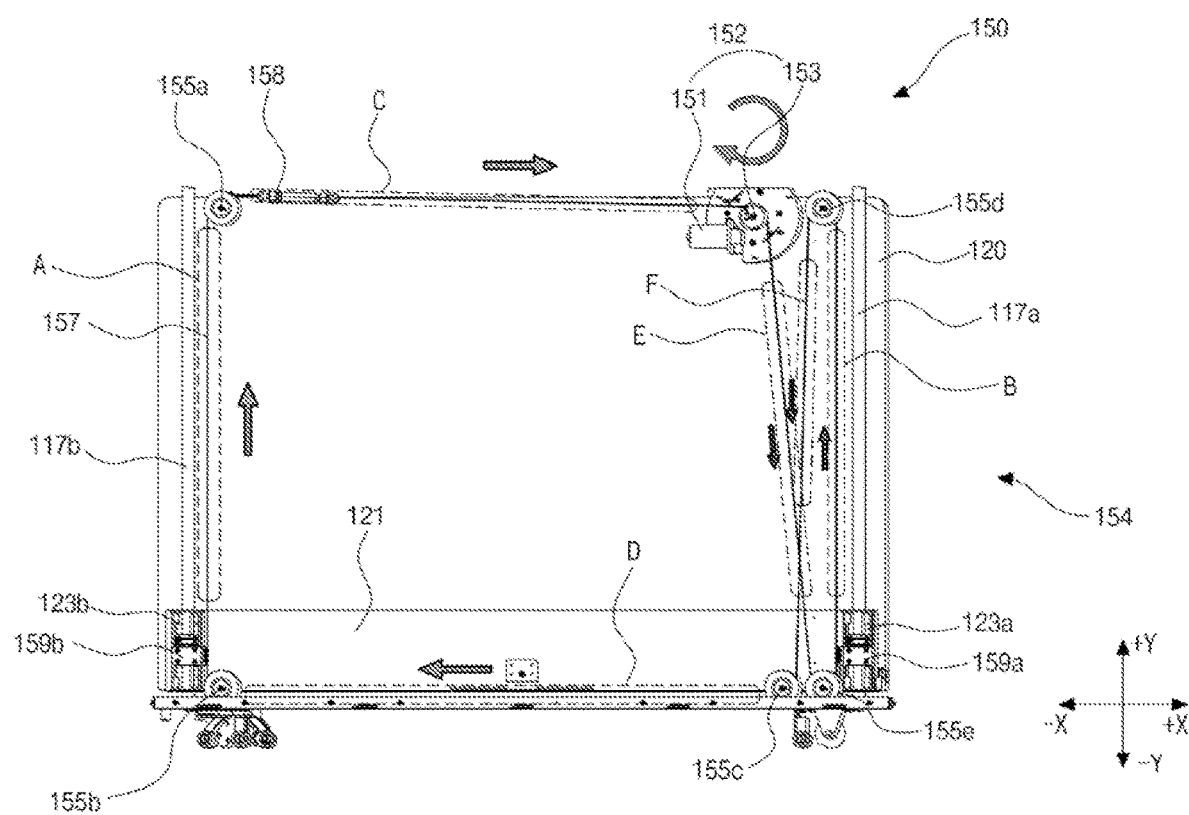
FIG. 5A is a perspective view illustrating the display device in which the display panel is pulled down according to an aspect of the present disclosure.
Figure 5B:
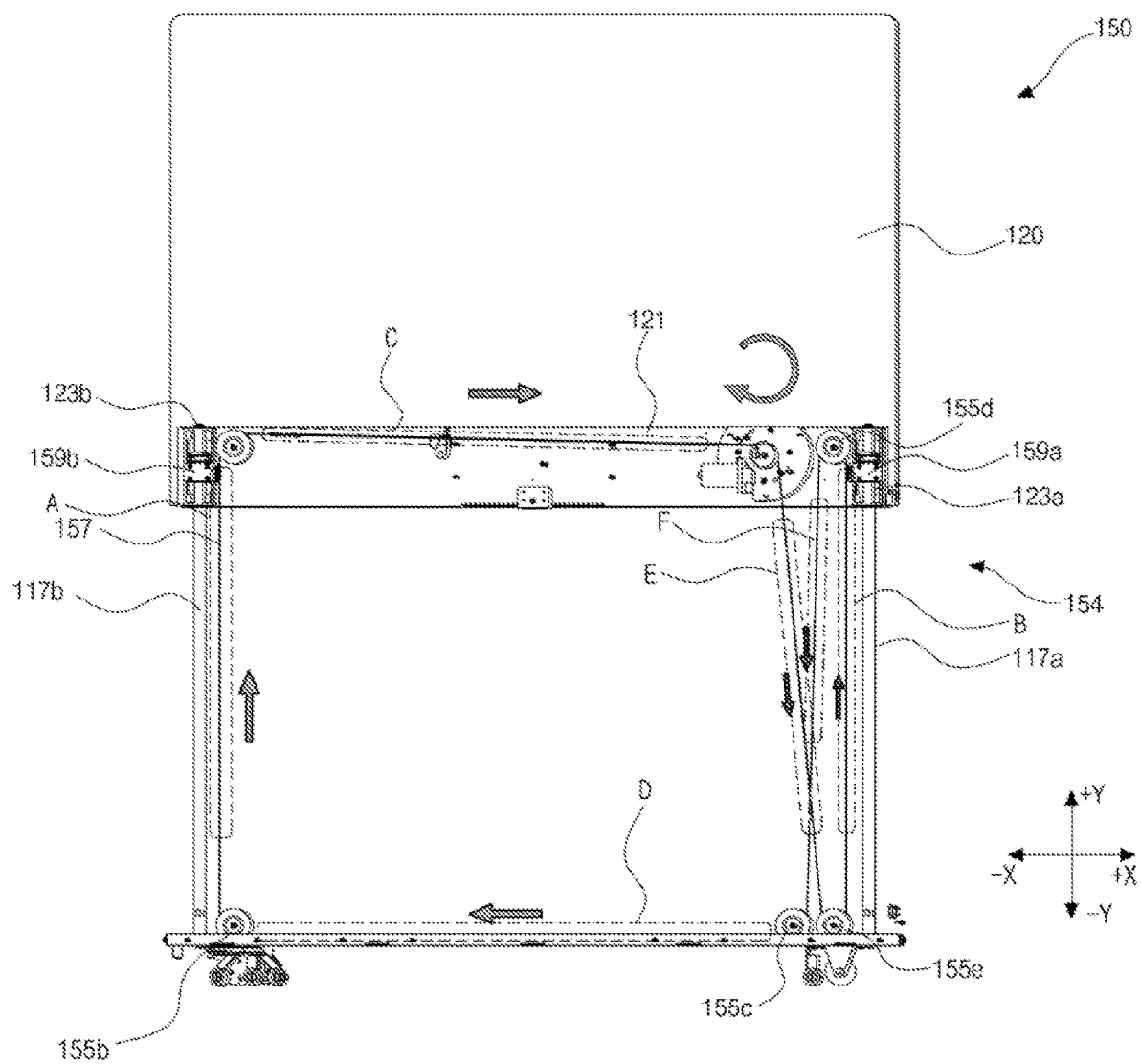
FIG. 5B is a perspective view illustrating the display device in which the display panel is pulled up according to an aspect of the present disclosure.
Figure 5C:
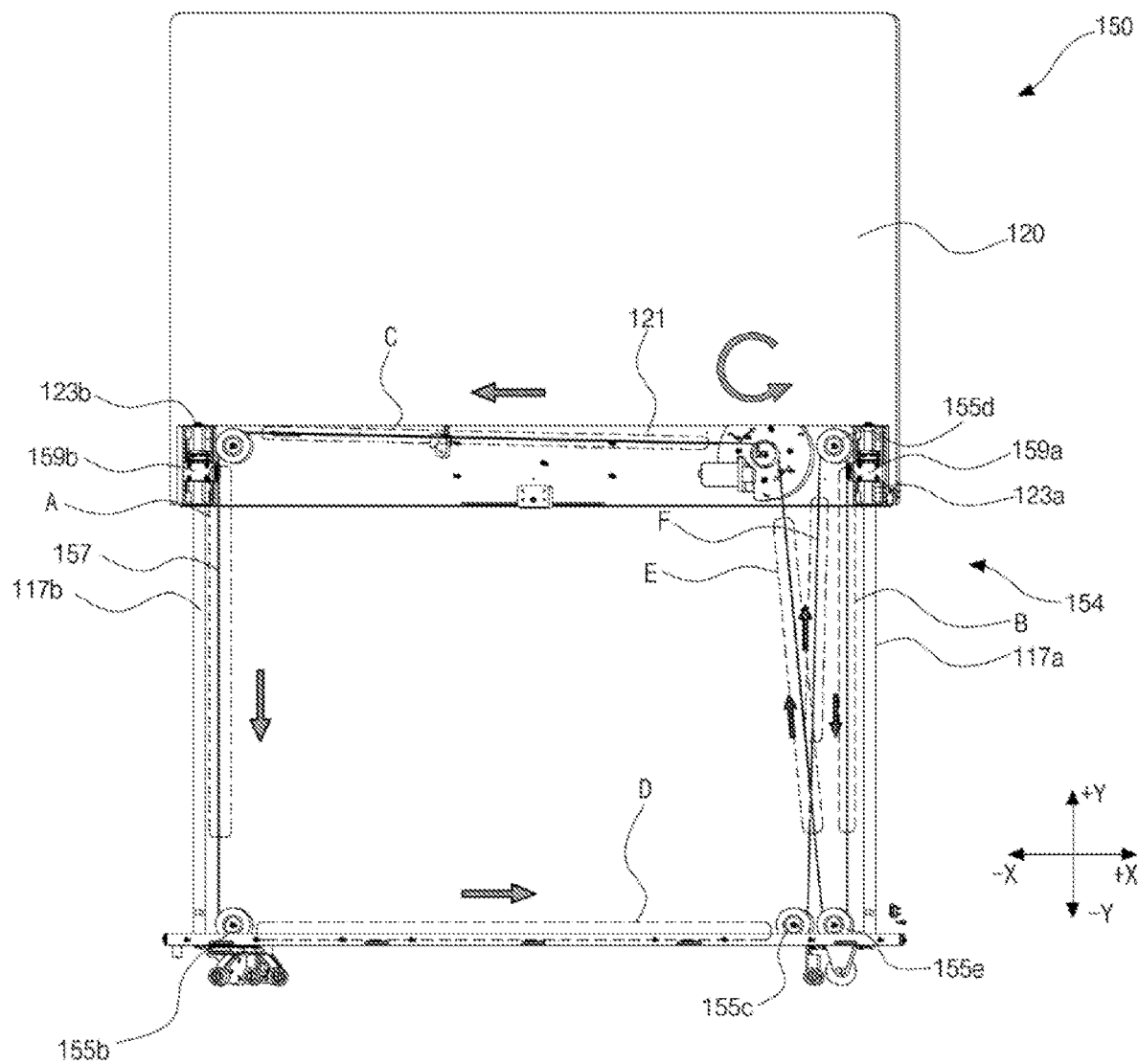
FIG. 5C is another perspective view illustrating the display device in which the display panel is pulled up according to an aspect of the present disclosure.
Figure 6:
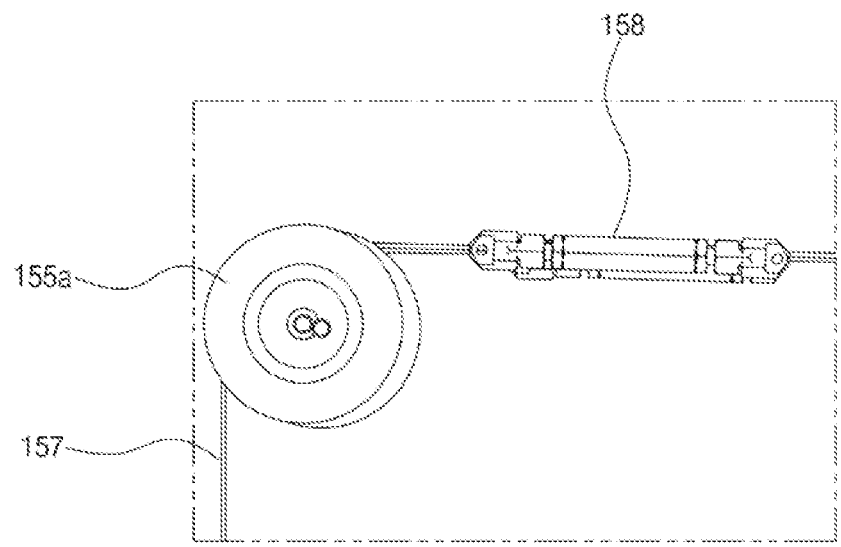
FIG. 6 is a perspective view illustrating a turnbuckle mounted on a first drive wire according to an aspect of the present disclosure.

FIG. 5A is a perspective view illustrating the display device in which the display panel is pulled down according to an aspect of the present disclosure, FIG. 5B is a perspective view illustrating the display device in which the display panel is pulled up according to an aspect of the present disclosure, and FIG. 5C is another perspective view illustrating the display device in which the display panel is pulled up according to an aspect of the present disclosure. FIG. 6 is a perspective view illustrating a turnbuckle mounted on a first drive wire according to an aspect of the present disclosure.

As shown, the display device 100 according to an aspect of the present disclosure can include the cover module 110, the display panel 120, the light blocking plate 130, first driving system 150 and second driving system 160, a pair of guide rails 170a and 170b, and first elevation assistance system 180 and second elevation assistance system 190.

The cover module 110 can have a box shape in which the display panel 120 and the first driving system 150 and second driving system 160 are accommodated and can include a front cover 111 and a rear cover 113. The front cover 111 can be disposed on the front surface of the display panel 120, the light blocking plate 130 can be disposed on the rear surface of the display panel 120, and the rear cover 113 can be disposed on the rear surface of the light blocking plate 130.

Here, the display panel 120 can be one of various display devices such as a liquid crystal display device (LCD), a plasma display panel device (PDP), a field emission display device (FED), an electroluminescence display device (ELD), and organic light-emitting diode display device (OLED). The display panel 120 may be used for the OLED, which is a representative of a flexible display device capable of maintaining display performance even when bent like paper.

The OLED is a self-luminous device, and can be lightweight and thin because it does not require a backlight used in a liquid crystal display device that is a non-luminous device.

The OLED also has wide viewing angles and high contrast ratio as compared with the liquid crystal display device and is of lower power consumption. In addition, the OLED is driven by low voltages of direct current (DC) and has a fast response time. Further, the OLED is strong against the external impacts and is used in a wide range of temperatures because its components are solids.

Particularly, since the manufacturing process is simple, the OLED has an advantage that the production cost can be greatly reduced compared to the liquid crystal display device.

The display panel 120 made of the OLED can include a first substrate and a second substrate facing the first substrate, and the first and second substrates can be spaced apart from and bonded to each other through an adhesive protective layer.

Although not shown, a driving thin film transistor can be formed for each pixel region on a first substrate, and a first electrode connected to each driving thin film transistor, an organic light-emitting layer on the first electrode and emitting light of a specific color, and a second electrode on the organic light-emitting layer can be provided for each pixel region. But the aspects are not limited thereto.

The organic light-emitting layer can express red, green, and blue colors. In general, a separate organic material emitting red, green, or blue light can be patterned and used for each pixel.

The first and second electrodes and the organic light-emitting layer formed therebetween can constitute a light-emitting diode. In the display panel having such a structure, the first electrode can serve as an anode, and the second electrode can serve as a cathode. However, the present disclosure is not limited thereto. Alternatively, the first electrode can serve as a cathode, and the second electrode can serve as an anode.

The display panel 120 according to the aspect of the present disclosure can include a transmission region and an emission region. The transmission region is a region that transmits the background seen through the rear surface of the display panel 120. That is, the background beyond the display panel 120 can be transmitted by the transmission region of the display panel 120 like transparent glass and can be provided to the user.

In addition, the light-emitting diode can be disposed in the emission region to display the image information implemented by the display panel 120.

A first bottom cover 121 can be equipped at the lower end of the display panel 120 with respect to a first direction, which is the direction in which the display panel 120 is withdrawn from the cover module 110 and pulled up. In an aspect, the first direction is +Y axis direction defined in the figures. However, the first direction could also be various directions applicable, e.g. a horizontal direction.

The first bottom cover 121 can be raised and lowered together with the display panel 120 while the display panel 120 is withdrawn from the cover module 110 or embedded in the cover module 110. When the display panel 120 is withdrawn from the cover module 110, the first bottom cover 121 can be disposed inside the cover module 110 to support the display panel 120.

The first bottom cover 121 can be connected to the first driving system 150.

As shown in FIG. 3A, a pair of first and second bushings 123a and 123b can be provided at both ends of the first bottom cover 121. The first and second bushings 123a and 123b can be respectively inserted into first and second guide bars 117a and 117b fixed to the cover module 110 and can be raised and lowered together with the display panel 120 along the longitudinal direction (e.g., Y direction) of the first and second guide bars 117a and 117b, that is, the vertical direction in the context of the figures.

The first and second bushings 123a and 123b and the first and second guide bars 117a and 117b can be disposed on both sides of the cover module 110, respectively, and the display panel 120 can be stably raised and lowered without being biased to either side when lowered to the inside and raised to the outside of the cover module 110.

In this case, the first and second guide bars 117a and 117b can further include a stopper for limiting the lifting height of the first and second bushings 123a and 123b. But the aspects are not limited thereto.

Although not shown in the figures, a second bottom cover can also be equipped at the lower end of the light blocking plate 130 disposed on the rear surface of the display panel 120. The second bottom cover can be raised and lowered together with the light blocking plate 130 and disposed inside the cover module 110. But the aspects are not limited thereto.

The second bottom cover can be connected to the second driving system 160.

In addition, a pair of third and fourth bushings can be provided at both ends of the second bottom cover. The third and fourth bushings can be raised and lowered together with the light blocking plate 130 along the longitudinal direction of third and fourth guide bars 118a and 118b fixed to the cover module 110, e.g., the vertical direction in the context of the figures.

The pair of guide rails 170a and 170b can be disposed at both ends of the display panel 120 and the light blocking plate 130 with respect to a second direction (e.g., X direction as shown in FIG. 5A) perpendicular to the first direction (+Y axis direction defined in the figures) in which the display panel 120 and the light blocking plate 130 are withdrawn. As shown in FIG. 3B, each of the pair of guide rails 170a and 170b can be provided with first and second fitting grooves 171 and 173 into which ends of the display panel 120 and the light blocking plate 130 are fitted and inserted, respectively.

Accordingly, the pair of guide rails 170a and 170b can support and guide both ends of each of the display panel 120 and the light blocking plate 130, respectively, when the display panel 120 and the light blocking plate 130 are raised and lowered from the cover module 110.

In this case, the front cover 111 can be provided with the first driving system 150 connected to the display panel 120. The light blocking plate 130 disposed on the rear surface of the display panel 120 can be connected to the second driving system 160 provided in the rear cover 113.

Referring in detail to the first driving system 150 with reference to FIG. 4A, the first driving system 150 can include a first motor assembly 152 and a first wire assembly 154, and the first motor assembly 152 can include a first motor 151 and a first wire drum 153.

Here, the first motor 151 can transmit rotational force to the first wire drum 153 and can include an electric motor and a speed reducer. The electric motor can provide the rotational force by using electricity and can be variously selected from a servo motor, a step motor, and the like.

The first motor 151 can precisely control a withdrawn length of the first wire assembly 154 wound around the first wire drum 153 by precisely controlling the rotation of the first wire drum 153.

As shown in FIG. 4B, the first wire drum 153 can include first and second winding parts 153a and 153b coupled to a rotatable shaft of the first motor 151. One end of a first driving wire 157 of the first wire assembly 154 can be connected to and wound around the first winding part 153a, and the other end of the first driving wire 157 of the first wire assembly 154 can be connected to and wound around the second winding part 153b.

The first wire assembly 154 can include first, second, third, fourth, and fifth pulleys 155a, 155b, 155c, 155d, and 155e together with the first driving wire 157. When the front cover 111 is divided into an upper end and a lower end, the first motor assembly 152 can be disposed to correspond to a first corner (right corner) of the upper end of the front cover 111. The first pulley 155a can be disposed to correspond to a second corner (left corner) of the upper end of the front cover 111 and can be positioned coaxially with the first motor assembly 152 in the second direction (+X/−X axis direction defined in the figures) perpendicular to the first direction. Alternatively, the first motor assembly 152 also can be disposed to correspond to a second corner (left corner) of the upper end of the front cover 111. The first pulley 155a can be disposed to correspond to a first corner (right corner) of the upper end of the front cover 111 and can be positioned coaxially with the first motor assembly 152 in the second direction (+X/−X axis direction defined in the figures) perpendicular to the first direction.

The second pulley 155b can be disposed to correspond to a second corner (left corner) of the lower end of the front cover 111 and can be positioned coaxially with the first pulley 155a in the first direction (+Y/−Y axis direction defined in the figures). The third pulley 155c can be disposed to correspond to a first corner (right corner) of the lower end of the front cover 111 and can be positioned coaxially with the second pulley 155b in the second direction (+X/−X axis direction defined in the figures) perpendicular to the first direction.

The fourth pulley 155d can be disposed to correspond to the first corner (right corner) of the upper end of the front cover 111. The fourth pulley 155d can be disposed on the outside of the first motor assembly 152 and positioned coaxially with the first motor assembly 152 in the second direction (+X/−X axis direction defined in the figures). The fifth pulley 155e can be disposed to correspond to the first corner (right corner) of the lower end of the front cover 111. The fifth pulley 155e can be disposed on the outside of the third pulley 155c and positioned coaxially with the third pulley 155c in the second direction (+X/−X axis direction defined in the figures).

The fourth pulley 155d and the fifth pulley 155e can be positioned coaxially with each other in the first direction (+Y/−Y axis direction defined in the figures).

In the first wire assembly 154, the first driving wire 157 can extend from the first winding part 153a of the first wire drum 153 of the first motor assembly 152 and span the first, second, third, fourth, and fifth pulleys 155a, 155b, 155c, 155d, and 155e, so that the other end of the first driving wire 157 can be wound around the second winding part 153b of the first wire drum 153.

That is, the first driving wire 157 wound around the first winding part 153a of the first wire drum 153 can go down while spanning the first pulley 155a and can span the second pulley 155b. Then, the first driving wire 157 can span the third pulley 155c while spanning the second pulley 155b, and the first driving wire 157 can come up to span the fourth pulley 155d. Next, the first driving wire 157 can go down while spanning the fourth pulley 155d and can span the fifth pulley 155e. After that, the first driving wire 157 can be wound around the second winding part 153b of the first wire drum 153. But the aspects are not limited thereto.

Accordingly, the first driving wire 157 of the first wire assembly 154 according to the aspect of the present disclosure can be rotated in one direction while forming a closed curve through the rotational force of the first motor assembly 152.

At this time, when the first driving wire 157 is divided into a first region A exposed between the first pulley 155a and the second pulley 155b and a second region B exposed between the fourth pulley 155d and the fifth pulley 155e, a pair of first and second wire fixing plates 159a and 159b can be fixed to the first and second regions A and B of the first driving wire 157, respectively, as shown in FIG. 4C.

Here, when the first driving wire 157 rotates while forming the closed curve through the rotational force of the first motor assembly 152, since the first region A and the second region B of the first driving wire 157 rotate in the same or substantially same direction, the pair of first and second wire fixing plates 159a and 159b fixed to the first and second regions A and B can be raised and lowered in the same or substantially same direction according to the rotation of the first driving wire 157.

Here, the pair of first and second wire fixing plates 159a and 159b can be assembled and fastened to the first and second bushings 123a and 123b, respectively. The pair of first and second wire fixing plates 159a and 159b can transmit power for lifting the display panel 120 to the first bottom cover 121.

Namely, the first and second bushings 123a and 123b to which the first and second wire fixing plates 159a and 159b are assembled and fastened can be mounted on the first bottom cover 121 provided at the lower end of the display panel 120, and the first and second regions A and B of the first driving wire 157 can be raised and lowered, so that the display panel 120 can also be raised and lowered along the longitudinal direction of the first and second regions A and B of the first driving wire 157 together with the first bottom cover 121 on which the first and second bushings 123a and 123b are mounted. But the aspects are not limited thereto.

Accordingly, the display panel 120 can be pulled down and embedded inside the cover module 110, or can be pulled up and withdrawn to the outside of the cover module 110.

That is, as shown in FIG. 5A, the display panel 120 can be embedded inside the cover module 110 and pulled down, and one end of the first driving wire 157 can be wound around the first winding part 153a of the first wire drum 153. When the first wire drum 153 of the first motor assembly 152 of the first driving system 150 rotates clockwise through the rotational force of the first motor 151, the third region C of the first driving wire 157 exposed between the first and second pulleys 155a and 155b of the first driving wire 157 can move from the first pulley 155a to the first motor assembly 152.

In addition, the first region A of the first driving wire 157 can move from the second pulley 155b to the first pulley 155a, and the fourth region D can move from the third pulley 155c to the second pulley 155b.

At the same time, the other end of the first driving wire 157 wound around the second winding part 153b of the first wire drum 153 can be unwound around the second winding part 153b, so that the fifth region E of the first driving wire 157 can move from the first motor assembly 152 to the fifth pulley 155e and the second region B of the first driving wire 157 can move from the fifth pulley 155e to the fourth pulley 155d.

Further, since the sixth region F of the first driving wire 157 can move from the fourth pulley 155d to the third pulley 155c, the first driving wire 157 can rotate while forming a closed curve between the first wire drum 153 of the first motor assembly 152 and the first, second, third, fourth, and fifth pulleys 155a, 155b, 155c, 155d, and 155e of the first driving wire 157.

At this time, both the first and second regions A and B of the first driving wire 157 can move up in the first direction (+Y axis direction defined in the figures), and the first and second wire fixing plates 159a and 159b fixed to the first and second regions A and B of the first driving wire 157 can move up. According to this, as shown in FIG. 5B, the first bottom cover 121 to which the first and second wire fixing plates 159a and 159b are assembled and fastened can move up, and thus the display panel 120 to which the bottom cover 121 is equipped can also be raised. But the aspects are not limited thereto.

Accordingly, the display panel 120 can be withdrawn to the outside of the cover module 110 and pulled up.

Meanwhile, in the state in which the display panel 120 is pulled up to the outside of the cover module 110, as shown in FIG. 5C, when the first wire drum 153 of the first motor assembly 152 of the first driving system 150 rotates counterclockwise through the rotational force of the first motor 151, one end of the first driving wire 157 wound around the first winding part 153a of the first wire drum 153 can be unwound from the first winding part 153a, and the third region C of the first driving wire 157 can move from the first motor assembly 152 to the first pulley 155a.

The first region A of the first driving wire 157 can move from the first pulley 155a to the second pulley 155b, and the fourth region D of the first driving wire 157 can move from the second pulley 155b to the third pulley 155c.

The sixth region F of the first driving wire 157 can move from the third pulley 155c to the fourth pulley 155d, and through this, the second region B of the first driving wire 157 can move from the fourth pulley 155d to the fifth pulley 155e.

At the same time, the other end of the first driving wire 157 can be wound around the second winding part 153b of the first wire drum 153. Accordingly, the fifth region E of the first driving wire 157 can move from the fifth pulley 155e to the first motor assembly.

At this time, both the first and second regions A and B of the first driving wire 157 can move down in the first direction (-Y axis direction defined in the figures), and the first and second wire fixing plates 159a and 159b fixed to the first and second regions A and B of the first driving wire 157 can move down. According to this, as shown in FIG. 5C, the first bottom cover 121 to which the first and second wire fixing plates 159a and 159b are assembled and fastened can move down, and thus the display panel 120 to which the bottom cover 121 is equipped can also be lowered. But the aspects are not limited thereto.

Accordingly, the display panel 120 can be pulled down and embedded into the inside of the cover module 110.

At this time, the first and second regions A and B of the first driving wire 157 can be disposed to correspond to both sides of the display panel 120, and the pair of first and second wire fixing plates 159a and 159b can be allowed to be disposed on both side of the display panel 120, so that the display panel 120 can be stably raised and lowered without being biased toward either side.

It is to be understood that the foregoing aspects of the first driving system are exemplary and explanatory. A first driving system according to example aspects of the present disclosure is not limited a particular structure or constitution, such as the quantity and/or position of components.

The second driving system 160 can also be configured as a structure same or similar to that of the first driving system 150. Although not shown, the second driving system 160 can include a second motor assembly and a second wire assembly. The second motor assembly can include a second motor and a second wire drum. But the aspects are not limited thereto.

The second wire assembly can include a second driving wire and sixth, seventh, eighth, ninth, and tenth pulleys. The second driving wire can extend from a third winding part of the second wire drum of the second motor assembly and span the sixth, seventh, eighth, ninth, and tenth pulleys, so that the other end of the second driving wire can be wound around a fourth winding part of the second wire drum.

In addition, a pair of third and fourth wire fixing plates can be fixed to first and second regions of the second driving wire, and the pair of third and fourth wire fixing plates can be assembled and fastened to the third and fourth bushings, respectively. The first and second regions of the second driving wire can move up and down, and according to this, the light blocking plate 130 can be raised and lowered along the longitudinal direction of the first and second regions of the second driving wire together with the second bottom cover on which the third and fourth bushings are mounted. But the aspects are not limited thereto.

Accordingly, the light blocking plate 130 can also be embedded into the inside of or withdrawn to the outside of the cover module 110.

The raising or lowering of the light blocking plate 130 through the second driving system 160 can be performed simultaneously with the display panel 120 or performed separately from the display panel 120 according to the user's intention.

Alternatively, in the display device 100 according to an aspect of the present disclosure, the display panel 120 and the light blocking plate 130 can be individually raised or lowered through the first and second driving systems 150 and 160, respectively, to be withdrawn out of the cover module 110 or embedded into the cover module 110.

Particularly, in the display device 100 according to the aspect of the present disclosure, the first and second driving systems 150 and 160 for raising and lowering the display panel 120 and the light blocking plate 130, respectively, can be allowed to be driven based on the first driving wire 157 and the second driving wire, and it is possible to prevent or alleviate a limitation of a decrease in reliability due to the driving belt from occurring.

That is, in the case of a driving system including a belt, when the belt is used for a long time, deformation can occur due to a decrease in the tension of the belt. In this case, vibration noise can be generated due to vibration of the belt, or the display panel 120 can be unstably raised and lowered.

Alternatively, damage to the display panel 120 can also be caused in the process of raising and lowering the display panel 120.

In contrast, in the display device 100 according to the aspect of the present disclosure, the first and second driving systems 150 and 160 can be configured to include the first driving wire 157 and the second driving wire which are formed of stainless steel having semi-permanent advantages, it is possible to prevent or alleviate the first driving wire 157 and the second driving wire from being deformed even when used for a long time.

In addition, the first and second driving systems 150 and 160 including the first driving wire 157 and second driving wire according to the aspect of the present disclosure can have a very simplified structure and reduce or minimize the number of parts, so that the manufacturing cost of the display device 100 can also be reduced.

Further, since the first driving wire 157 and second driving wire of the first and second driving systems 150 and 160 can be formed in a closed curve, it is possible to prevent or alleviate the display panel 120 or the light blocking plate 130 from being pulled out from the first and second driving wires 157, respectively.

In the case that the first driving wire 157 and second driving wire are not formed in a closed curve, the display panel 120 or the light blocking plate 130 can be pulled out from the first driving wire 157 and second driving wire to cause the damage of the display panel 120 or the light blocking plate 130 in the process of transporting the display device 100. However, in the display device 100 according to the aspect of the present disclosure, the first driving wire 157 and second driving wire can be configured to form a closed curve, it is also possible to present the display panel 120 or the light blocking from being pulled out from the first driving wire 157 and second driving wire.

In particular, as shown in FIG. 6, a tightening mechanism for adjusting the tension of the wire, such as a turnbuckle 158, can be further provided to the first driving wire 157 and second driving wire.

The turn buckle 158 is a component having a screw rod at both ends in the longitudinal direction thereof. The male screw at one end of the turn buckle 158 is a right-hand screw, and the male screw at the other end of the turn buckle 158 is a left-hand screw. When a component with the female screw, that is, the adjusting nut is rotated, the two male screws of the turn buckle 158 can approach each other, and when the adjusting nut is rotated reversely, the two male screws of the turn buckle 158 can move away from each other.

Through this, when the tension of the first driving wire 157 and second driving wire is decreased by using the first and second driving wires 157 for a long time, the tension of the first driving wire 157 and second driving wire can be controlled through the turn buckle 158.

At this time, a control printed circuit board 127a connected to the display panel 120, a main board 127b, and a power board 127c can be mounted inside the cover module 110, and a cable penetrating member 128 can also be further provided to protect a cable for connecting the main board 127b and the control printed circuit board 127a and a power cable for connecting the power board 127c and the control printed circuit board 127a.

One end of the cable penetrating member 128 can be mounted on the cover module 110, and the other end of cable penetrating member 128 can be coupled to the first bottom cover 121, so that the other end of the cable penetrating member 128 can be raised and lowered together when the display panel 120 is raised and lowered with respect to the cover module 110.

In the cable penetrating member 128, a plurality of connecting members having an empty space therein can be rotatably connected to each other so that the cable can pass through the one end from the other end of the cable penetrating member 128. Accordingly, when the display panel 120 is raised and lowered, the cable penetrating member 128 can maintain the "U" shape in which lengths of both sides thereof are changed so as to allow the cable to be raised and lowered without being interfered and damaged by the surrounding electronic components.

The display device 100 according to an aspect of the present disclosure can further include the first and second elevation assistance systems 180 and 190. By controlling the speeds of raising and lowering of the display panel 120 and the light blocking plate 130 from the cover module 110 through the first and second elevation assistance systems 180 and 190, it is possible to prevent or alleviate the display panel 120 and the light blocking plate 130 from being rapidly lowered when embedded inside the cover module 110.

This will be described in more detail with reference to FIGS. 7A and 7B.

Figure 7A:
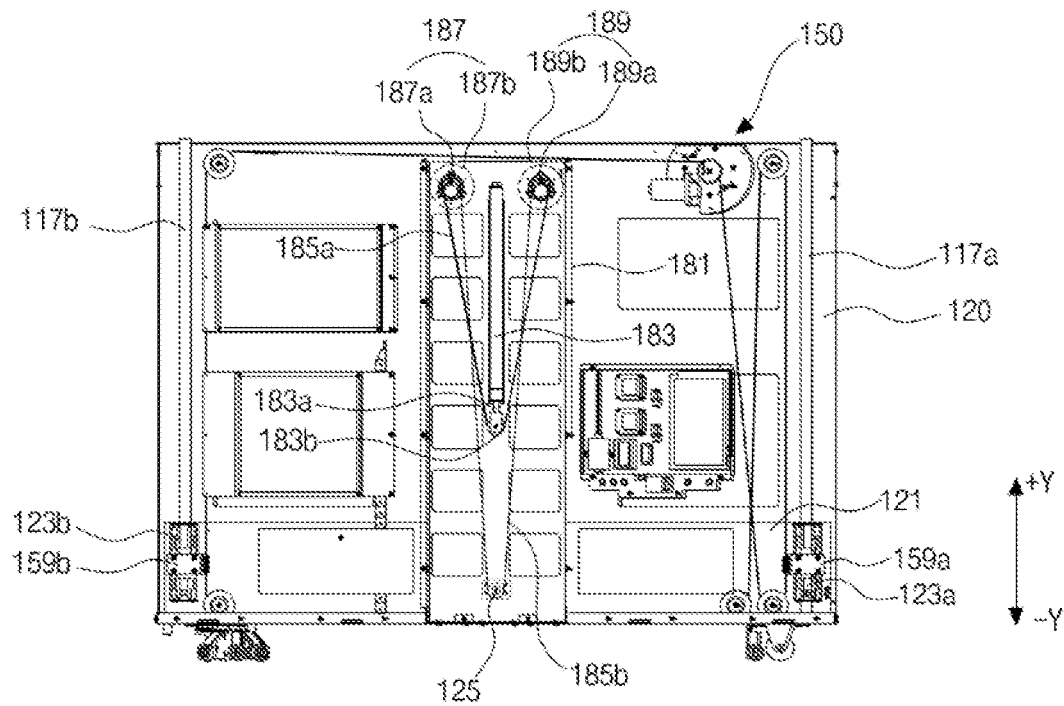
FIGS. 7A and 7B are perspective views illustrating operation of the first elevation assistance system according to an aspect of the present disclosure.
Figure 7B:
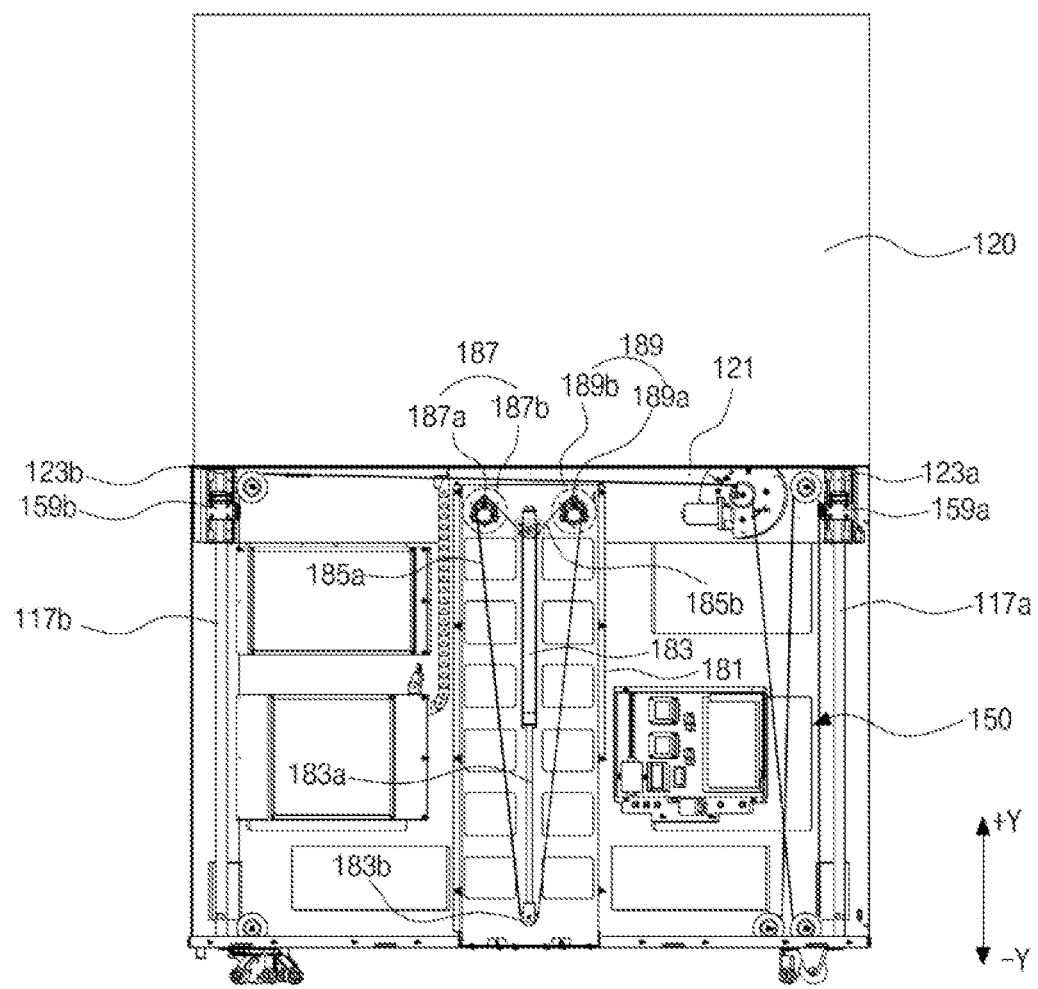

FIGS. 7A and 7B are perspective views illustrating the display panel and the first elevation assistance system of the display device according to an aspect of the present disclosure. FIG. 7A shows a state in which the display panel is embedded inside the cover module and pulled down, and FIG. 7B shows a state in which the display panel is withdrawn outside the cover module and pulled up.

As shown in the figures, a rotatable first bottom wheel 125 can be mounted on the first bottom cover 121 equipped at the lower end of the display panel 120, and the first elevation assistance system 180 can be disposed on the front side of the display panel 120 corresponding to the first bottom wheel 125.

The first elevation assistance system 180 can include a first elevation plate 181, a first gas spring 183 equipped to the first elevation plate 181, first and second wires 185a and 185b connected to the first gas spring 183, and first and second wheel brackets 187 and 189.

The first elevation plate 181 can be formed to have its longitudinal direction along the first direction (+Y/−Y axis direction defined in the figures) in which the display panel 120 is withdrawn from the cover module 110 of FIG. 2. The first and second wheel brackets 187 and 189 can be equipped at the upper end of the front surface of the first elevation plate 181 based on the rear surface of which can face the display panel 120, and the first gas spring 183 can be disposed between the first and second wheel bracket 187 and 189.

The first and second wheel brackets 187 and 189 can penetrate the first elevation plate 181, first and second wheels 187a and 189a can protrude from the front surface of the first elevation plate 181, and third and fourth wheels 187b and 189b interlocked with the first and second wheels 187a and 189a, respectively, can protrude from the rear surface of the first elevation plate 181.

The first gas spring 183 can be equipped with a first rod 183a that increases or decreases along the longitudinal direction of the first gas spring 183, and a first spring wheel 183b can be installed at one end of the first rod 183a. The first wire 185a can be wound around the first spring wheel 183b while its one end is rotatably fixed to the first wheel 187a and its other end is rotatably fixed to the second wheel 189a.

The second wire 185b can be wound around the first bottom wheel 125 mounted on the bottom cover 121 of the display panel 120 while its one end is rotatably fixed to the third wheel 187b protruding from the rear surface of the first elevation plate 181 and its other end is rotatably fixed to the fourth wheel 189b.

At this time, the one ends of the first and second wires 185a and 185b can be fixed to the first and third wheels 187a and 187b, respectively, to be wound in opposite directions to each other. The other ends of the first and second wires 185a and 185b can be fixed to the second and fourth wheels 189a and 189b, respectively, to be wound in opposite direction to each other.

The first gas spring 183 tries to expand its volume according to the amount of gas filled therein, so that the first gas spring 183 can make the first and second wires 185a and 185b increase by the force to expand the volume. Accordingly, when the one end of the first wire 185a is wound around the first wheel 187a, the one end of the second wire 185b can be unwound from the third wheel 187b. When the other end of the first wire 185a is wound around the second wheel 189a, the other end of the second wire 185b can be unwound from the fourth wheel 189b.

On the contrary, when the one end and the other end of the first wire 185a are unwound from the first and second wheels 187a and 189a, respectively, the one end and the other end of the second wire 185b can be wound around the third and fourth wheels 187b and 189b, respectively.

That is, as shown in FIG. 7A, in a pull-down state when the display panel 120 is embedded inside the cover module 110 of FIG. 2, the first bottom cover 121 equipped at the lower end of the display panel 120 can be disposed to correspond to the lower end of the first elevation assistance system 180, and the second wire 185b wound around the third and fourth wheels 187b and 189b can be unwound, thereby increasing the length of the second wire 185b. Through this, the first wire 185a can be wound around the first and second wheels 187a and 189a.

Accordingly, the first rod 183a of the first gas spring 183 can be embedded and disposed inside the first gas spring 183.

At this time, when the display panel 120 is to be withdrawn from the cover module 110 of FIG. 2 through the first driving system 150, that is, when the display panel 120 is to be disposed in the pull-up state from the pull-down state, the display panel 120 can be withdrawn from the cover module 110 of FIG. 2, and the second wire 185b can be wound around the third and fourth wheels 187b and 189b, so that the first wire 185a can be unwound from the first and second wheels 187a and 189a and become longer.

In addition, in the first gas spring 183 of the first elevation assistance system 180, the first rod 183a can be extended in the +Y axis direction defined in the figures, and thus the force can be applied to the first gas spring 183 in the +Y axis direction defined in the figures.

Accordingly, the force can also be applied to the display panel 120 withdrawn from the cover module 110 of FIG. 2 in the +Y axis direction defined in the figures. Since the forces can be applied to the first elevation assistance system 180 and the display panel 120 in the same or substantially same direction, the display panel 120 can be more easily withdrawn from the cover module 110 of FIG. 2 with a small force.

On the contrary, as shown in FIG. 7B, when the display panel 120 is disposed to be withdrawn outside the cover module 110 of FIG. 2, that is, when the display panel 120 is to be disposed in the pull-down state from the pull-up state, the first bottom cover 121 equipped at the lower end of the display panel 120 can be disposed to correspond to the upper end of the first elevation assistance system 1801, and the second wire 185b can be wound around the third and fourth wheels 187b and 189b. Through this, the first wire 185a can be unwound from the first and second wheels 187a and 189a and become longer.

Accordingly, the first rod 183a of the first gas spring 183 can be extended to the outside of the first gas spring 183.

In this case, when the display panel 120 is tried to be embedded inside the cover module 110 of FIG. 2 through the first driving system 150, the second wire 185b can be unwound from the third and fourth wheels 187b and 189b due to the display panel 120 embedded inside the cover module 110 of FIG. 2, so that the first wire 185a can be wound around the first and second wheels 187a and 189a.

In addition, in the first gas spring 183 of the first elevation assistance system 180, the first rod 183a can be gradually reduced from the state in which the first rod 183a is extended in the +Y axis direction defined in the figures, and the force can be applied to the first gas spring 183 in the +Y axis direction defined in the figures until the first rod 183a is completely inserted into the first gas spring 183.

Accordingly, a force can be applied to the display panel 120 embedded into the cover module 110 of FIG. 2 in the −Y axis direction defined in the figures. The forces can be applied to the first elevation assistance system 180 and the display panel 120 in the opposite directions.

At this time, since the force applied to the first elevation assistance system 180 and the force applied to the display panel 120 are balanced with each other, the user can easily lower the display panel 120 at a stable speed.

Therefore, it is possible to prevent or alleviate the display panel 120 from being rapidly lowered in the process of embedding the display panel 120 inside the cover module 110 of FIG. 2, and it is also possible to prevent or alleviate the display panel 120 from being damaged.

Here, the second elevation assistance system 190 of FIG. 2 can also have the same or substantially same structure as the first elevation assistance system 180, so that when the light blocking plate 130 of FIG. 2 is raised and lowered through the second driving system 160 of FIG. 2, the speeds of raising and lowering the light blocking plate 130 of FIG. 2 from the cover module 110 of FIG. 2 can be controlled through the second elevation assistance system 190 of FIG. 2. Accordingly, it is possible to prevent or alleviate the light blocking plate 130 of FIG. 2 from being rapidly lowered in the process of embedding the light blocking plate 130 of FIG. 2 inside the cover module 110 of FIG. 2.

As described above, in the display device 100 of FIG. 2 according to the aspect of the present disclosure, the display panel 120 and the light blocking plate 130 of FIG. 2 can be allowed to be individually raised and lowered so as to be withdrawn from or embedded into the cover module 110 of FIG. 2. Thus, the display panel 120 and the light blocking plate 130 of FIG. 2 can be raised and lowered from furniture, an appliance, a facility, or the like such as a bed headboard, a desk, or a partition through a simple structure and operation such as the first and second driving systems 150 and 160 of FIG. 2 including the first driving wire 157 and second driving wire to thereby improve space utilization, interior, and design.

In addition, through the transparent display panel 120, the user can be allowed to watch the image at both sides of the display panel 120, and the light blocking plate 130 of FIG. 2 can be further raised and lowered on the rear surface of the transparent display panel 120, so that the concentration of the image implemented through the transparent display panel 120 can be improved. Accordingly, the user can feel the image implemented from the display panel 120 more clearly.

Particularly, in the display device 100 according to the aspect of the present disclosure, the first and second driving systems 150 and 160 for raising and lowering the display panel 120 and the light blocking plate 130 of FIG. 2, respectively, can be configured to be driven based on the first driving wire 157 and second driving wire, so that it is possible to reduce or prevent a limitation of deterioration of reliability due to the driving belt. Since the first and second driving systems 150 and 160 of FIG. 2 has the very simplified structure and reduces or minimizes the number of parts, the manufacturing cost of the display device 100 of FIG. 2 can also be reduced.

In addition, since the first driving wire 157 and second driving wire of the first and second driving systems 150 and 160 of FIG. 2 are formed in the closed curve, it is also possible to prevent the display panel 120 and the light blocking plate 130 of FIG. 2 from being withdrawn from the first driving wire 157 and second driving wire.

Further, the display device 100 of FIG. 2 according to the aspect of the present disclosure can further include the first and second elevation assistance systems 180 and 190 of FIG. 2, and the speeds of raising and lowering the display panel 120 and the light blocking plate 130 can be controlled, so that the display panel 120 and the light blocking plate 130 of FIG. 2 can be prevented or alleviated from being rapidly lowered in the process of embedding them inside the cover module 110 of FIG. 2.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a cover module having a storage space therein;
a display panel configured to be at least partially disposed inside the storage space or withdrawn outside the storage space; and
a first driving system configured to embed and withdraw the display panel into and from the cover module in a first direction,
wherein the first driving system includes a first wire drum, a first driving wire, and a plurality of pulleys, and
wherein the first wire drum includes a first winding part and a second winding part, and the first driving wire has a first end wound around the first winding part of the first wire drum, spans the plurality of pulleys and has a second end wound around the second winding part of the first wire drum.

2. The display device of claim 1,
further comprising a turn buckle mounted on the first driving wire.

3. A display device comprising:
a cover module having a storage space therein;
a display panel configured to be at least partially disposed inside the storage space or withdrawn outside the storage space; and
a first driving system configured to embed and withdraw the display panel into and from the cover module in a first direction;
a bottom cover equipped at a lower end of the display panel in the first direction; and
a cable penetrating member, one end of which is mounted on the cover module, another end thereof is coupled to the bottom cover,
wherein the first driving wire is connected to the bottom cover, and
wherein the first driving system includes a first wire drum, a first driving wire.

4. The display device of claim 3, wherein the first driving system includes:
a motor assembly including the first wire drum, the first driving wire, and a wire assembly including first, second, third, fourth, and fifth pulleys guiding the first driving wire,
wherein a first end of the first driving wire is wound around a first winding part of the first wire drum, and a second end of the first driving wire is wound around a second winding part of the first wire drum,
wherein a portion between the first end and the second end of the first driving wire spans the first, second, third, fourth, and fifth pulleys, and
wherein first and second regions of the first driving wire exposed at an outermost side in a second direction perpendicular to the first direction are moved in a same direction.

5. The display device of claim 4, wherein the motor assembly and the first pulley are positioned coaxially with each other in the second direction, the second pulley and the third pulley are positioned coaxially with each other in the second direction, the first pulley and the second pulley are positioned coaxially with each other in the first direction, and the third pulley and the motor assembly are positioned coaxially with each other in the first direction, and wherein the fourth pulley is disposed on an outside portion of the motor assembly, the fifth pulley is disposed on an outside portion of the third pulley, and the fourth pulley and the fifth pulley are positioned coaxially with each other in the first direction.

6. The display device of claim 5, wherein the first region is exposed between the first pulley and the second pulley, and the second region is exposed between the fourth pulley and the fifth pulley.

7. The display device of claim 4, wherein when the first end of the first driving wire is wound around the first winding part, the second end of the first driving wire is unwound from the second winding part, and
when the first end of the first driving wire is unwound from the first winding part, the second end of the first driving wire is wound around the second winding part, and the first driving wire forms a closed curve.

8. The display device of claim 4, wherein the motor assembly further includes a motor, and the first wire drum receives a rotational force of the motor.

9. The display device of claim 4, wherein the first and second regions are fixed to both ends of the bottom cover through first and second wire fixing plates, respectively.

10. The display device of claim 9, wherein a pair of bushings are mounted on the both ends of the bottom cover, and the pair of bushings are inserted into a pair of guide bars equipped to the cover module to be moved in the first direction.

11. The display device of claim 10, wherein the first and second wire fixing plates are equipped to the pair of bushings.

12. The display device of claim 1, wherein the first direction is vertical direction, a bottom cover is equipped at a lower end of the display panel, and a bottom wheel is mounted on the bottom cover, and
a first elevation assistance system is coupled to the bottom wheel.

13. The display device of claim 12, wherein the first elevation assistance system includes an elevation plate, first and second wheel brackets, a gas spring between the first and second wheel brackets, and first and second wires, and
a rod provided with a spring wheel is mounted at an end of the gas spring.

14. The display device of claim 13, wherein the first wire is disposed on a front surface of the elevation plate, and the second wire is disposed on a rear surface of the elevation plate,
the first wire is wound around the spring wheel while its one end is fixed to a first wheel of the first wheel bracket and its another end is fixed to a second wheel of the second wheel bracket, and
the second wire is wound around the bottom wheel while its one end is fixed to a third wheel of the first wheel bracket and its another end is fixed to a fourth wheel of the second wheel bracket.

15. The display device of claim 14, wherein the third wheel is interlocked with the first wheel, and the fourth wheel is interlocked with the second wheel.

16. The display device of claim 1, further comprising:
a light blocking plate on a rear surface of the display panel and configured to be at least partially embedded inside the storage space or withdrawn outside the storage space; and
a second driving system configured to embed and withdraw the light blocking plate into and from the cover module in the first direction, wherein the second driving system includes a second wire drum and a second driving wire.

17. The display device of claim 16, wherein the display panel is a transparent display panel.

18. The display device of claim 16, further comprising a pair of guide rails disposed at both ends of the cover module in a second direction perpendicular to the first direction and provided with fitting grooves for supporting both ends of each of the display panel and the light blocking plate, respectively.

19. A display device, comprising:
- a cover module including a front cover and a rear cover and having a storage space therebetween;
- a display panel configured to be at least partially disposed inside the storage space or withdrawn outside the storage space;
- a light blocking plate on a rear surface of the display panel and configured to be at least partially embedded inside the storage space or withdrawn outside the storage space;
- a first driving system disposed in the front cover and configured to move the display panel into and outside the cover module in a first direction; and
- a second driving system disposed in the rear cover and configured to move the light blocking plate into and outside the cover module in the first direction,
- wherein the display panel and light blocking plate are configured to be individually or simultaneously moved in the first direction through the first driving system and second driving system, respectively.

20. The display device of claim 19, wherein the first driving system includes a plurality of pulleys, a first wire drum and a first driving wire,
- wherein the first wire drum includes a first winding part and a second winding part, and
- wherein the first driving wire has a first end wound around the first winding part of the first wire drum, spans the plurality of pulleys and has a second end wound around the second winding part of the first wire drum, and forms a closed curve.

21. The display device of claim 20, wherein the second driving system is configured to be the same as the first driving system.

* * * * *